US009997433B2

(12) United States Patent
Jang et al.

(10) Patent No.: US 9,997,433 B2
(45) Date of Patent: Jun. 12, 2018

(54) HEAT DISSIPATING DEVICE AND MANUFACTURING METHOD OF HEAT DISSIPATING DEVICE

(71) Applicant: WISTRON CORP., New Taipei (TW)

(72) Inventors: Yung-Li Jang, New Taipei (TW); Kai-Hua Wang, New Taipei (TW); Ming-Chih Chen, New Taipei (TW)

(73) Assignee: WISTRON CORP., New Taipei (TW)

( * ) Notice: Subject to any disclaimer, the term of this patent is extended or adjusted under 35 U.S.C. 154(b) by 690 days.

(21) Appl. No.: 14/133,765

(22) Filed: Dec. 19, 2013

(65) Prior Publication Data

US 2015/0000872 A1   Jan. 1, 2015

(30) Foreign Application Priority Data

Jun. 27, 2013   (CN) .......................... 2013 1 0263629

(51) Int. Cl.
*H05K 7/20* (2006.01)
*H01L 23/427* (2006.01)
(Continued)

(52) U.S. Cl.
CPC ........ *H01L 23/427* (2013.01); *F28D 15/0275* (2013.01); *H01L 23/367* (2013.01);
(Continued)

(58) Field of Classification Search
CPC ... H05K 7/20336; H01L 23/427; H01L 23/42; H01L 23/367; H01L 23/3672
(Continued)

(56) References Cited

U.S. PATENT DOCUMENTS 6,408,934 B1   6/2002   Ishida et al.
6,966,363 B2 *  11/2005   Gailus ..................... F28F 13/00
                                              165/104.33
(Continued)

FOREIGN PATENT DOCUMENTS

CN   101207995 A   6/2008
CN   102693950 A   9/2012
(Continued)

OTHER PUBLICATIONS

China Patent Office, Office action dated Aug. 1, 2016.
Taiwan Patent Office, Office action dated May 7, 2015.

*Primary Examiner* — Jianying Atkisson
*Assistant Examiner* — Joel Attey
(74) *Attorney, Agent, or Firm* — Li&Cai Intellectual Property (USA) Office

(57) ABSTRACT

A heat dissipating device includes a heat dissipating module, a heat pipe, and an injection molded member formed by molding and solidifying. The heat pipe has a transfer segment, a heat input segment, and a heat output segment. The heat input segment and the heat output segment are respectively integrally extended from two opposite ends of the transfer segment. The heat input segment and the heat output segment each has a contact surface, and at least one of the contact surfaces contacts the heat dissipating module. The injection molded member connects to the heat dissipating module and a portion of the heat pipe, which contacts the heat dissipating module, for keeping the connection of the heat dissipating module and the contact surface of the heat pipe. The instant disclosure also provides a manufacturing method of the heat dissipating device by using connection of the injection molded member.

7 Claims, 17 Drawing Sheets

(51) Int. Cl.
*F28D 15/02* (2006.01)
*H01L 23/367* (2006.01)
*H01L 23/42* (2006.01)
*H01L 23/467* (2006.01)

(52) U.S. Cl.
CPC .......... *H01L 23/3672* (2013.01); *H01L 23/42* (2013.01); *H01L 23/467* (2013.01); *H01L 2924/0002* (2013.01); *H05K 7/20336* (2013.01)

(58) Field of Classification Search
USPC .................................................. 165/104.33
See application file for complete search history.

(56) References Cited

U.S. PATENT DOCUMENTS

| | | | |
|---|---|---|---|
| 7,589,965 B2 | 9/2009 | Liang et al. | |
| 7,742,295 B2* | 6/2010 | Hata | G06F 1/20 165/80.4 |
| 8,111,517 B2 | 2/2012 | Chang | |
| 2008/0043436 A1* | 2/2008 | Hung | G06F 1/20 361/700 |
| 2008/0142193 A1* | 6/2008 | Li | B21D 53/08 165/80.3 |
| 2011/0261533 A1* | 10/2011 | Yang | H01L 23/427 361/697 |
| 2014/0078673 A1* | 3/2014 | Vincent | H05K 7/20336 361/700 |
| 2014/0182818 A1* | 7/2014 | Wang | G06F 1/20 165/104.21 |

FOREIGN PATENT DOCUMENTS

| | | |
|---|---|---|
| KR | 10-2010-0111101 | 10/2010 |
| TW | 200806162 A | 1/2008 |
| TW | 201137583 A1 | 11/2011 |
| TW | 201240291 A1 | 10/2012 |
| TW | 201305525 A1 | 2/2013 |

* cited by examiner

HEAT DISSIPATING DEVICE AND MANUFACTURING METHOD OF HEAT DISSIPATING DEVICE

BACKGROUND OF THE INVENTION

1. Field of the Invention

The instant disclosure relates to a heat dissipating device and a manufacturing method thereof; more particularly, to a heat dissipating device without any welding manner and a manufacturing method of a heat dissipating device by using an injection molded member.

2. Description of Related Art

The chip of the electronic device is capable of fast operation so as to generate extremely high temperature, so that the chip needs to dissipate heat by connecting to a heat dissipating device for enabling the temperature of chip to be maintained below the critical temperature of chip. The conventional heat dissipating device includes a plurality of components, and the conventional heat dissipating device is manufactured by assembling the components, and then fixing the components by welding.

However, the construction and the producing process of the conventional heat dissipating device takes too much manpower costs. Specifically, the producing process of the conventional heat dissipating device is related to the construction of conventional heat dissipating device, so that the construction of conventional heat dissipating device needs much manpower to manufacture and is resisting automatic process to be applied on the heat dissipating device. According to the statistics, forming the conventional heat dissipating device by the above producing process (i.e., assembling and welding) requires fifteen people each spends six minutes to complete.

To achieve the abovementioned improvement, the inventors strive via industrial experience and academic research to present the instant disclosure, which can provide additional improvement as mentioned above.

SUMMARY OF THE INVENTION

One embodiment of the instant disclosure provides a heat dissipating device and a manufacturing method of the heat dissipating device by using an injection molded member, and the instant disclosure is provided for rapidly producing the heat dissipating device without welding process.

The heat dissipating device comprises: a heat dissipating module; a heat pipe having a transfer segment, a heat input segment, and a heat output segment, the heat input segment and the heat output segment respectively extended from two opposite ends of the transfer segment; wherein each of the heat input segment and the heat output segment includes a contact surface, and at least one of the contact surfaces is abutted against the heat dissipating module; and an injection molded member connecting to the heat dissipating module and a portion of the heat pipe connected to the heat dissipating module, wherein the injection molded member is configured to maintain the connection between the heat dissipating module and the abutted contact surface connected to the heat dissipating module.

The manufacturing method of the heat dissipating device comprises: disposing a heat dissipating module and a heat pipe in a mold, wherein at least one of two opposite end portions of the heat pipe abuts against the heat dissipating module for jointly defining an injection channel by the mold, the heat dissipating module, and the abutted end portion of the heat pipe; injecting a melted plastic into the mold to fill in the injection channel; and solidifying the melted plastic to form an injection molded member, wherein the heat dissipating module and the abutted end portion of the heat pipe are combined by the injection molded member to maintain the connection between the heat dissipating module and the abutted end portion of the heat pipe.

In summary, the heat dissipating device of the instant disclosure is formed by injection molding for promoting the manufacturing process of the heat dissipating device to become automatic process, thereby reducing the cost of manpower.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Please refer to FIGS. 1 through 17, which show a plurality of embodiments of the instant disclosure. In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

Please refer to FIGS. 1 and 2, which show a heat dissipating device 100 intended for abutting against a heat generating component (not shown), such that heat generated from the heat generating component (e.g., chip) can be transferred to dissipate by the heat dissipating device 100, thereby maintaining the temperature of the heat generating component below a critical temperature of the heat generating component.

Figure 1:
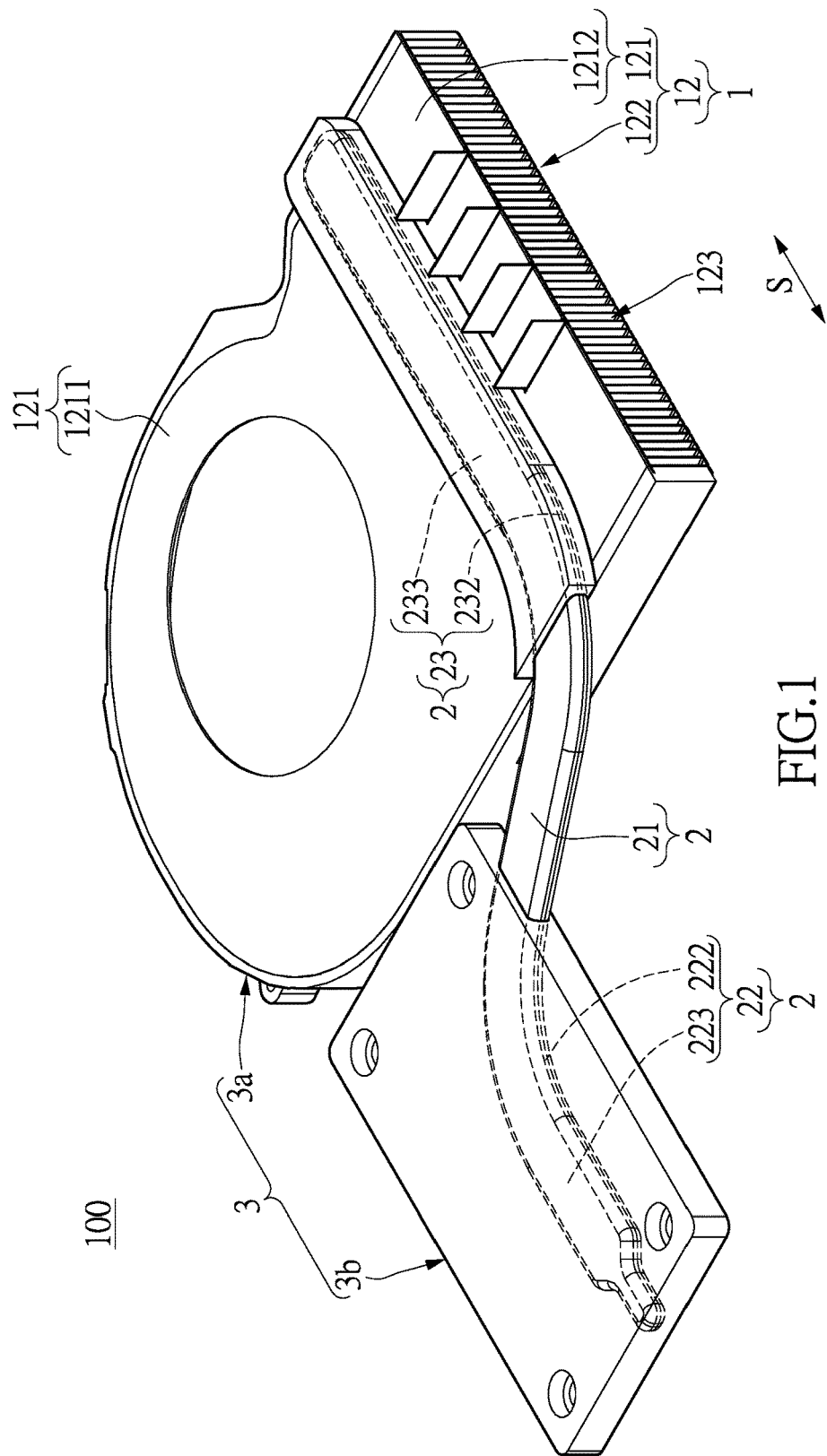
FIG. 1 is a perspective view of a heat dissipating device according to the instant disclosure.
Figure 2:
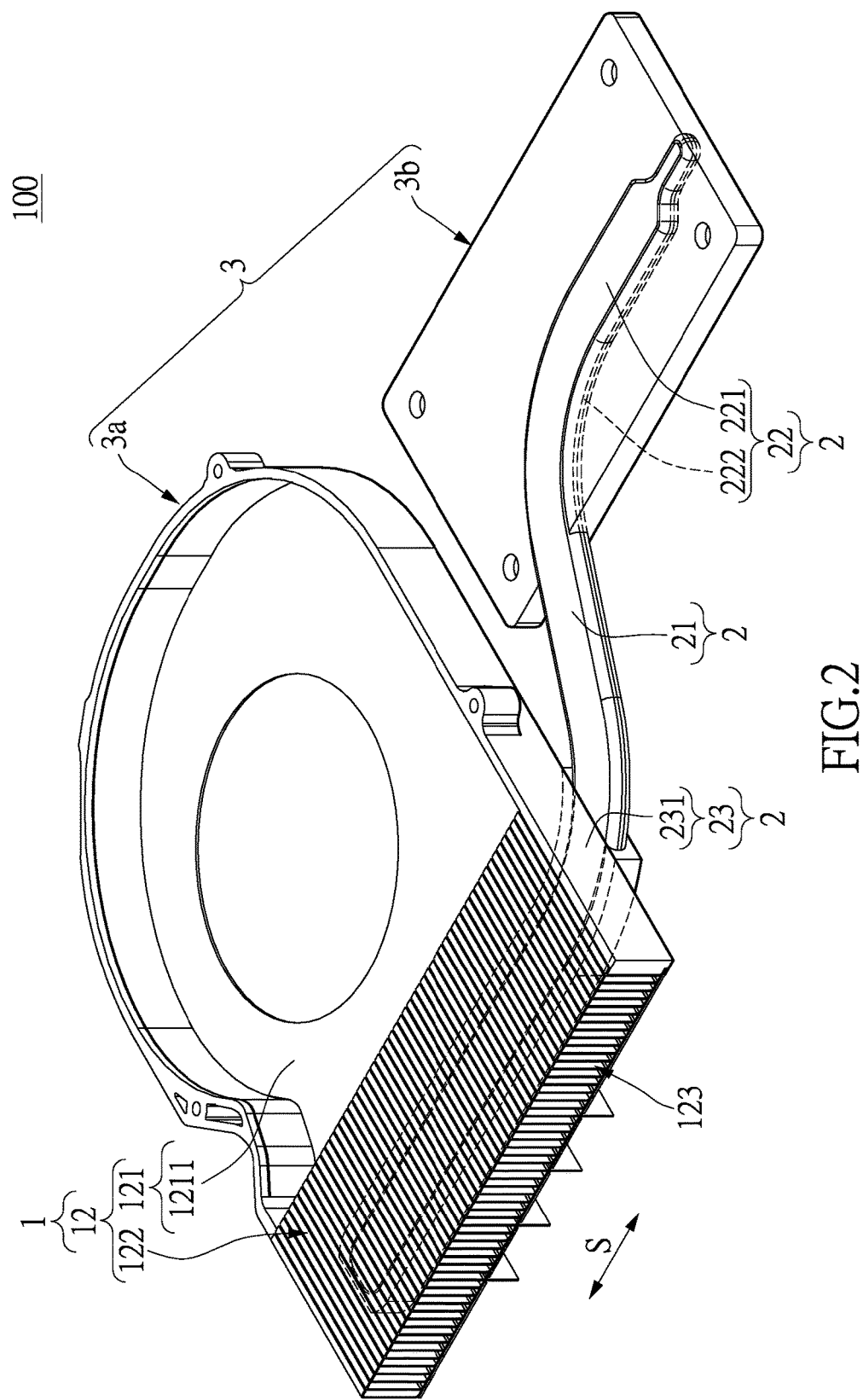
FIG. 2 is another perspective view of the heat dissipating device according to the instant disclosure.
Figure 3:
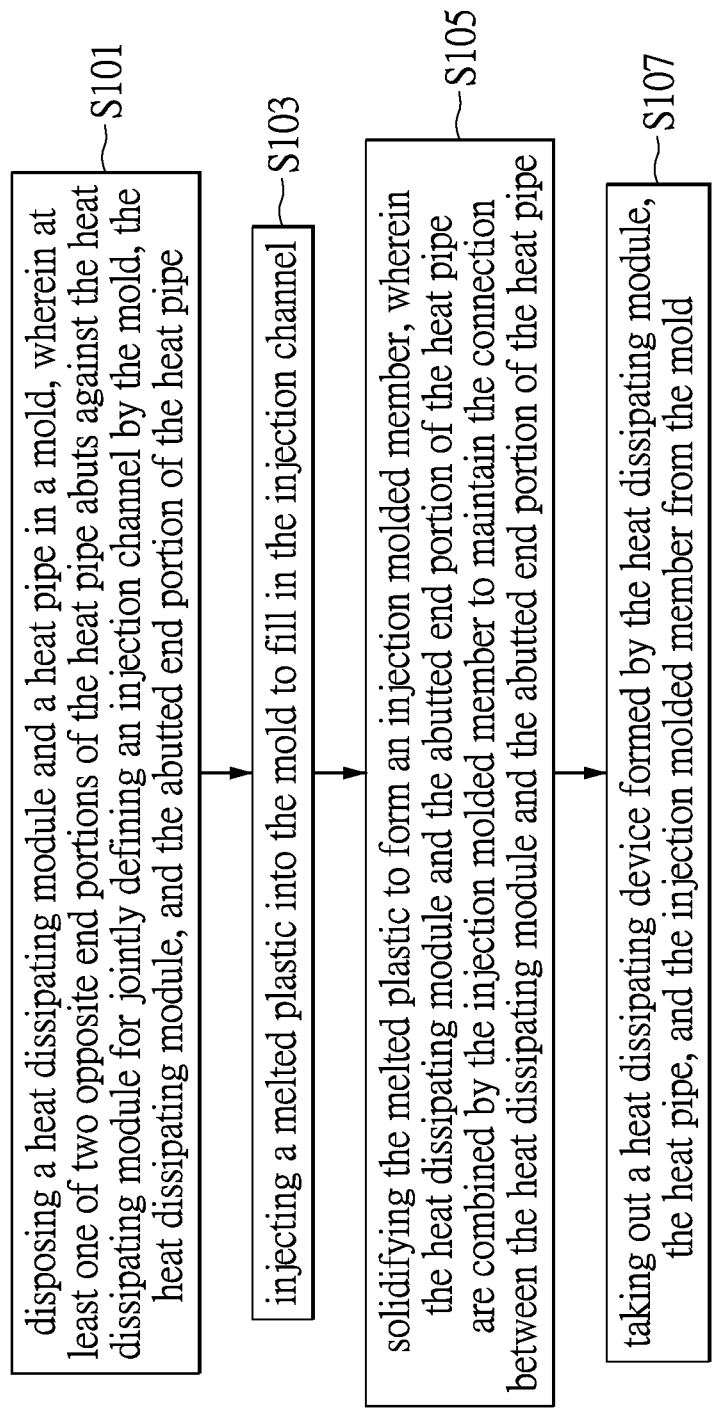
FIG. 3 is a flow chart of a manufacturing method of the heat dissipating device according to the instant disclosure.

Please refer to FIG. 3, and with reference occasionally made to FIGS. 1 and 2. A manufacturing method of the heat dissipating device 100 includes the steps as follows.

Step S101: disposing a heat dissipating module 1 and a heat pipe 2 in a mold (not shown), wherein at least one of two opposite end portions of the heat pipe 2 abuts against the heat dissipating module 1 for jointly defining an injection channel by the mold, the heat dissipating module 1, and the abutted end portion of the heat pipe 2.

Step S103: injecting a melted plastic (not shown) into the mold to fill in the injection channel, wherein the melting point of the plastic is preferably lower than 200□, the plastic is preferably a heat conduction plastic, but the plastic is not limited to the above limitations.

Step S105: solidifying the melted plastic to form an injection molded member 3, wherein the injection molded member 3 are seamlessly connecting the heat dissipating module 1 and the abutted end portion of the heat pipe 2 for maintaining the connection between the heat dissipating module 1 and the abutted end portion of the heat pipe 2. The glass transition temperature (Tg) of the injection molded member 3 is higher than the working temperature of the heat dissipating device 100 (e.g., the operating temperature of the heat dissipating device 100).

Step S107: taking out the heat dissipating device 100 formed by the heat dissipating module 1, the heat pipe 2, and the injection molded member 3 from the mold.

The steps S101 to S107 are the main processes of the manufacturing method of the heat dissipating device 100. The heat dissipating device 100, which is produced by the steps S101 to S107, can be formed in different constructions by adjusting the cavity of the mold according to the designer's requirement.

The heat dissipating device 100 includes the common structural features in the following embodiments, and the common structural features are disclosed as follows. Please refer to FIGS. 1 and 2. The heat dissipating device 100 includes a heat dissipating module 1, a heat pipe 2, and an injection molded member 3 having a first injection molded member 3a and a second injection member 3b. The heat pipe 2 has a transfer segment 21, a heat input segment 22, and a heat output segment 23. The heat input segment 22 and the heat output segment 23 are respectively extended from two opposite ends of the transfer segment 21.

Specifically, each of the heat input segment 22 and the heat output segment 23 includes a contact surface 221, 231, two arced fixing surfaces 222, 232 respectively extended from two opposite edges of the contact surface 221, 231, and an assisting surface 223, 233 arranged at opposite side with respect to the contact surface 221, 231. The contact surfaces 221, 231 and the assisting surfaces 223, 233 are flat surfaces for example. The arced fixing surfaces 222, 232 are formed in protruding type in the instant disclosure, but the arced fixing surfaces 222, 232 can be formed in concaving type (not shown).

At least one of the contact surfaces 221, 231 is abutted against the heat dissipating module 1, and the injection molded member 3 is substantially and seamlessly connected to the arced fixing surfaces 222 of the heat input segment 22 and/or the arced fixing surfaces 232 of the heat output segment 23.

Moreover, the construction of the heat dissipating device 100 takes the following embodiments for example, but is not limited to the embodiments. Specifically, the heat input segment 22, a portion of the injection molded member 3 (hereafter referred as the second injection molded member 3b) connected to the heat input segment 22, and the components of the heat dissipating module 1 connected to the heat input segment 22 are regarded as a heat conductive set, and the heat output segment 23, a portion of the injection molded member 3 (hereafter referred as the first injection molded member 3a) connected to the heat output segment 23, and the components of the heat dissipating module 1 connected to the heat input segment 22 are regarded as a heat dissipating set. In the following embodiments, the portion of the injection molded member 3 (i.e., the second injection molded member 3b) of the heat conductive set is spaced apart from the portion of the injection molded member 3 (i.e., the first injection molded member 3a) of the heat dissipating set. Each of the first injection molded member 3a and the second injection molded member 3b can be integrally formed in one piece. Each of the heat conductive set and the heat dissipating set has different embodiments, and each embodiment of the heat conductive set and the heat dissipating set can be applied independently or cooperating with each other.

[Heat Conductive Set]

The heat conductive set is disclosed in the following three embodiments, but is not limited to the three embodiments. Moreover, the common structural features of the three embodiments (i.e., the structure of the heat pipe 2) have been disclosed, so that the following description does not disclose again. The injection molded member 3 disclosed in the following three embodiments is referred as the portion of the injection molded member 3 (i.e., the second injection molded member 3b) of the heat conductive set connected to the heat input segment 22.

First Embodiment

Figure 4:
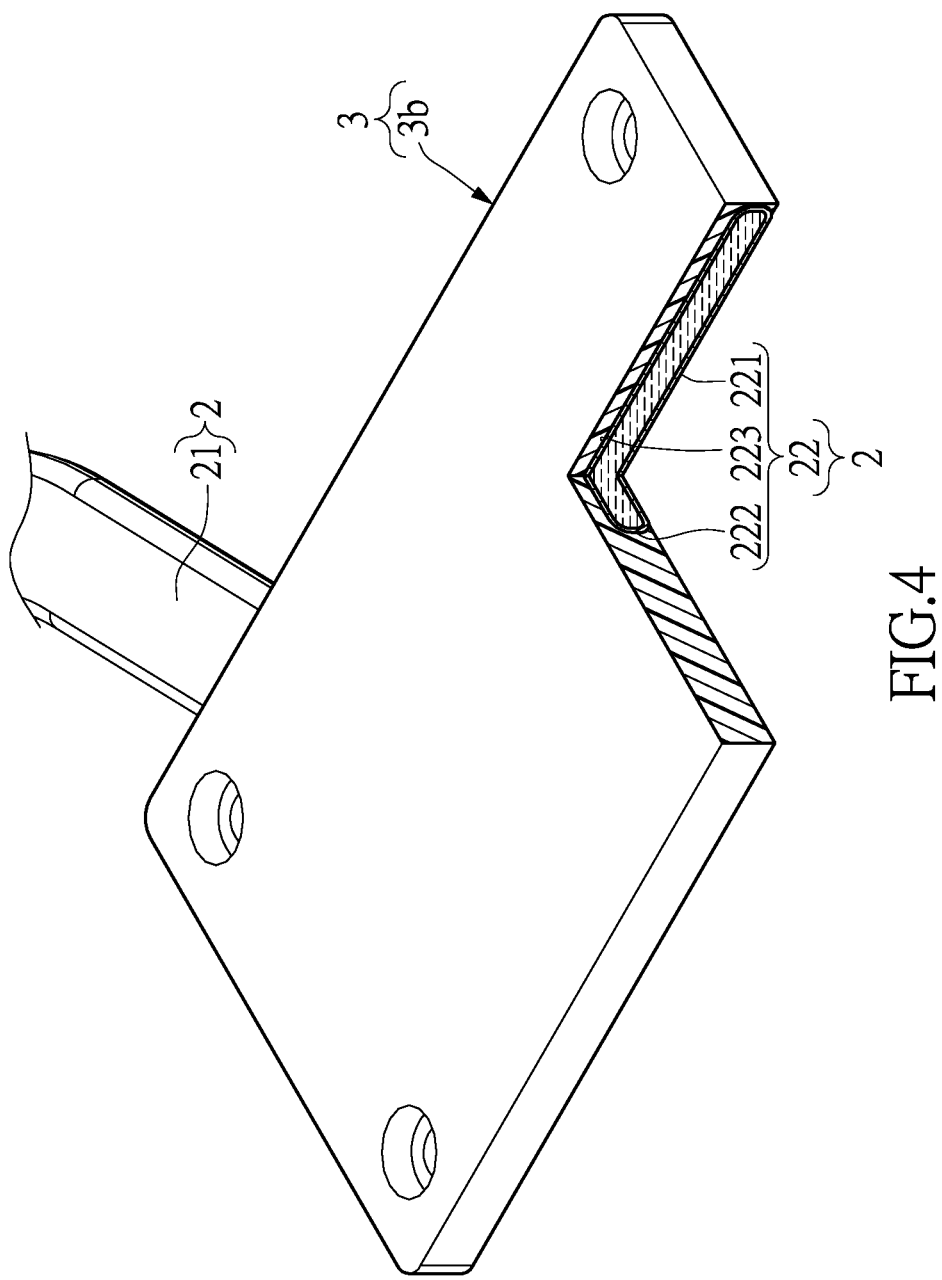
FIG. 4 is a cross-sectional view illustrating a heat conductive set of the heat dissipating device according to a first embodiment of the instant disclosure.
Figure 7:
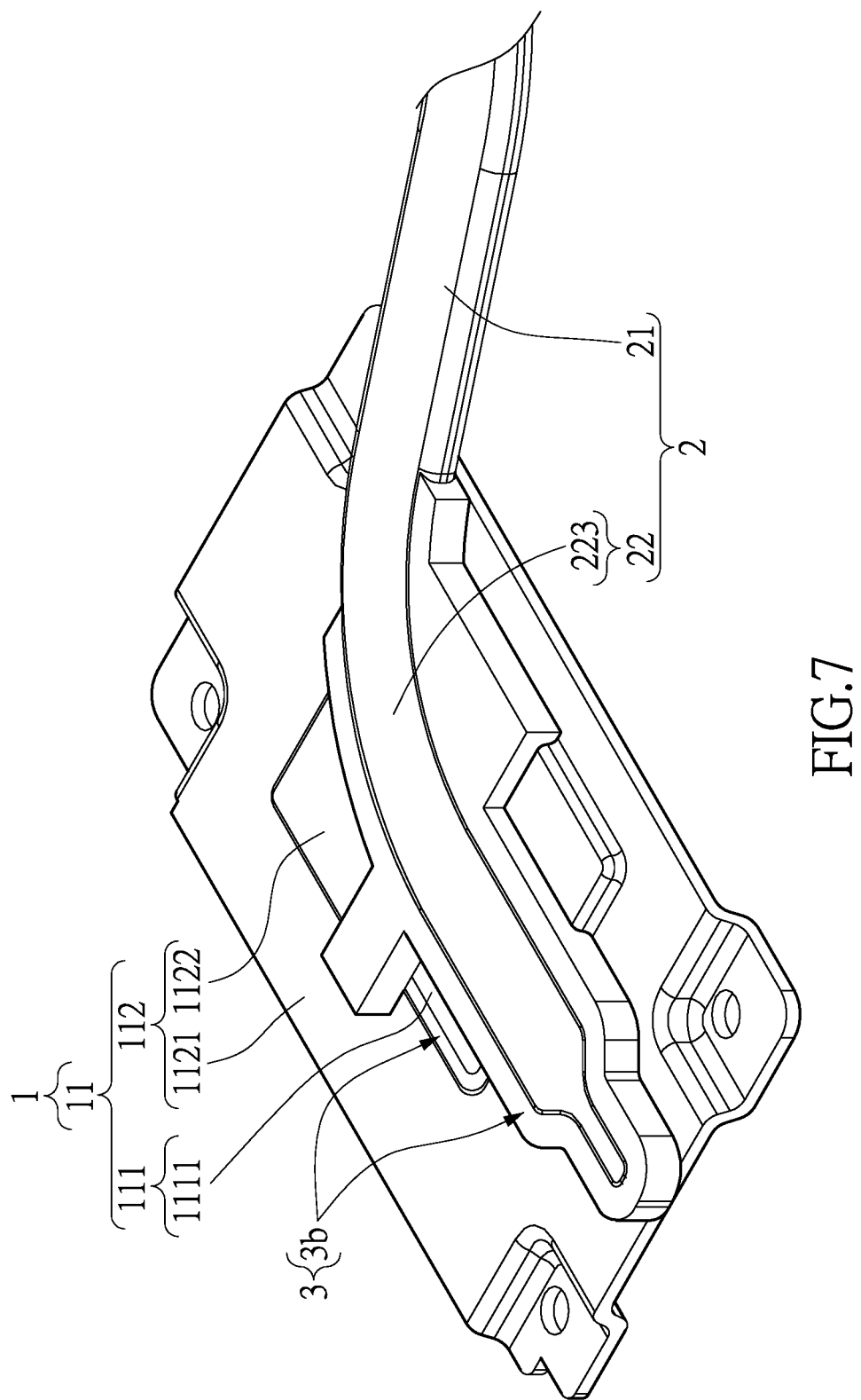
FIG. 7 is a perspective view illustrating the heat conductive set of the heat dissipating device according to a third embodiment of the instant disclosure.

Please refer to FIGS. 1, 2, and 4. The second injection molded member 3b is an integrally formed structure, and the contour of the second injection molded member 3b is approximately a rectangular plate, so that the heat conductive set in the instant embodiment is formed without a fixing plate 112 and a heat conductive block 111 (as shown in FIG. 7). The inner surface of the second injection molded member 3b is substantially and seamlessly connecting to the fixing surfaces 222 and the assisting surface 223 for establishing a firm connection between the second injection molded member 3b and the heat input segment 22, and the arced design of the fixing surface 222 is further enhancing the above connection.

Moreover, the contact surface 221 of the heat input segment 22 exposes from the second injection molded member 3b for abutting against a heat generating component (not shown). The contact surface 221 and the adjacent outer surface of the second injection molded member 3b are preferably in coplanar arrangement, but are not limited thereto.

Second Embodiment

Figure 5:
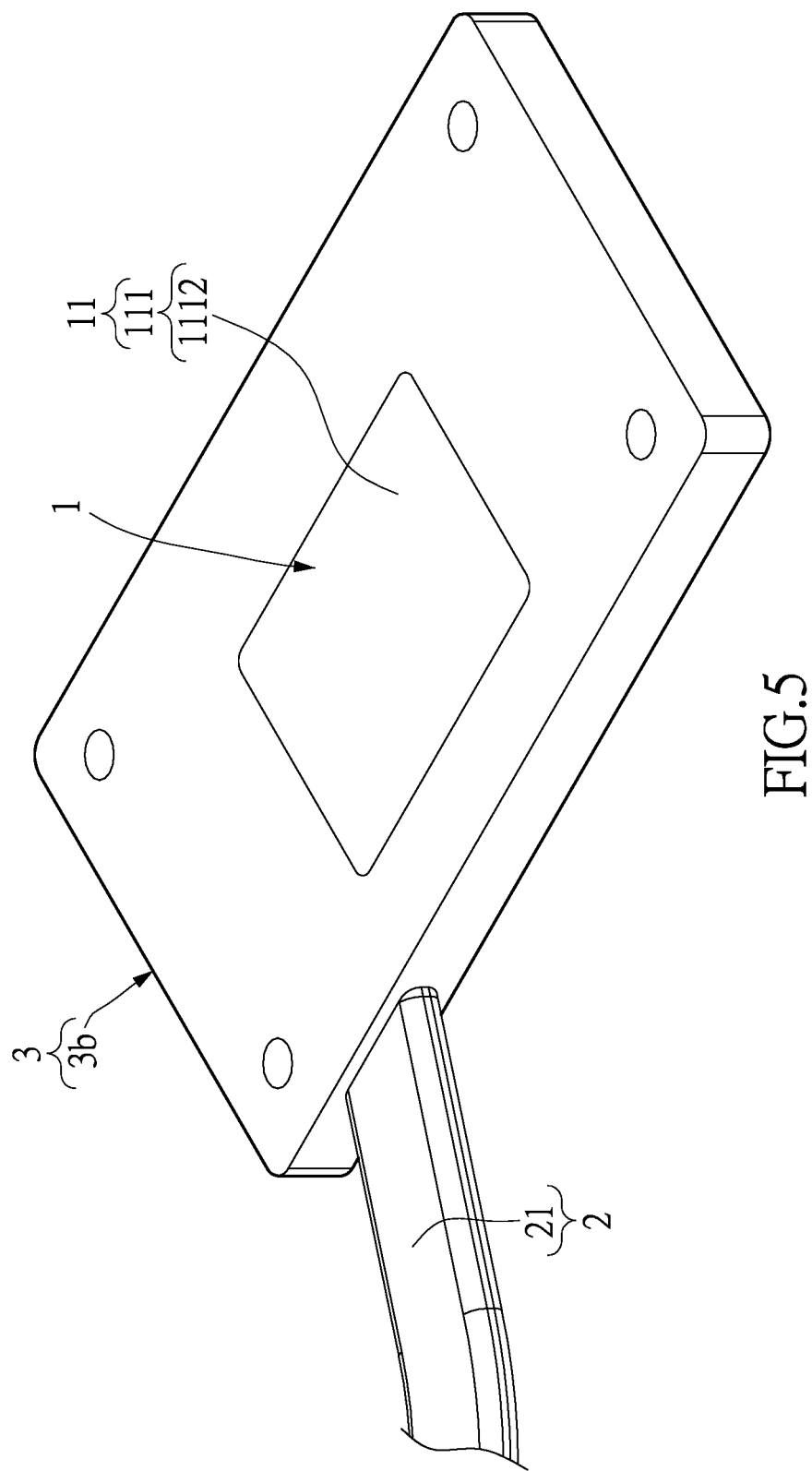
FIG. 5 is a perspective view illustrating the heat conductive set of the heat dissipating device according to a second embodiment of the instant disclosure.
Figure 6:
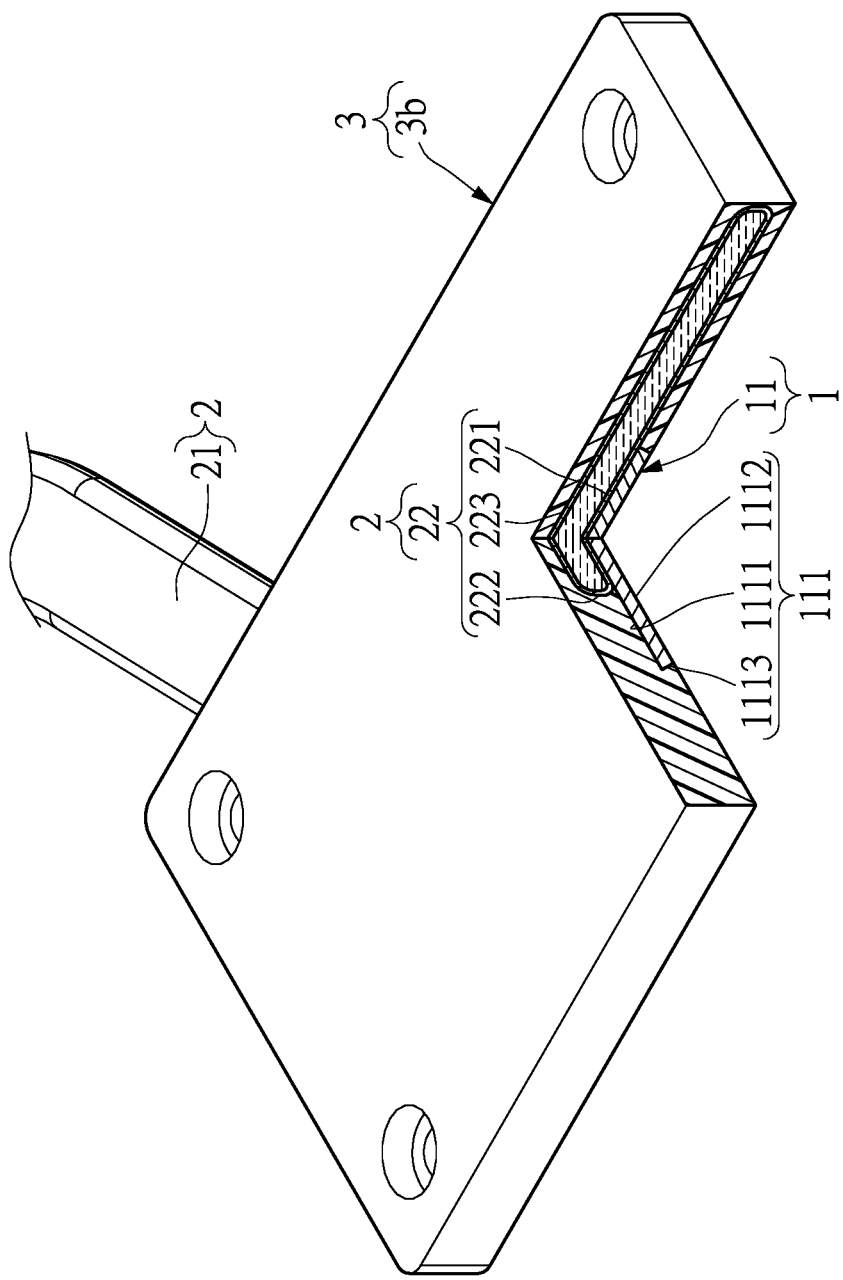
FIG. 6 is a cross-sectional view illustrating the heat conductive set of the heat dissipating device according to the second embodiment of the instant disclosure.

Please refer to FIGS. 5 and 6. The heat dissipating module 1 includes a heat conductive unit 11, and the heat conductive unit 11 in the instant embodiment takes a sheet-like heat conductive block 111 for example. The heat conductive block 111 has a first surface 1111, a second surface 1112, and an annular lateral surface 1113. The first and second surfaces 1111, 1112 are two opposite surfaces of the heat conductive block 111, and the lateral surface 1113 connects an edge of the first surface 1111 and an edge of the second surface 1112. Specifically, the cross-section of the lateral surface 1113 of the heat conductive block 111 gradually reduces from the first surface 1111 to the second surface 1112. That is to say, the lateral surface 1113 is slantingly extended and tapered from the edge of the first surface 1111 to the edge of the second surface 1112.

The contact surface 221 of the heat input segment 22 is abutted against the first surface 1111 of the heat conductive block 111. The second injection molded member 3b is an integrally formed structure, and the contour of the second injection molded member 3b is approximately a rectangular plate, so that the heat conductive set in the instant embodiment is formed without a fixing plate 112 (as shown in FIG. 7). Moreover, the inner surface of the second injection molded member 3b is substantially and seamlessly connecting to the fixing surfaces 222 and the assisting surface 223 of the heat input segment 22, the lateral surface 1113, and a portion of the first surface 1111, which is not connected to the heat input segment 22, such that the second injection molded member 3b is configured to establish a firm connection with the heat input segment 22 and the heat conductive block 111, and the arced design of the fixing surface 222 and the slanting design of the lateral surface 1113 are further enhancing the above connection, thereby maintaining the connection between the heat conductive block 111 and the contact surface 221 of the heat input segment 22.

Additionally, the second surface 1112 of the heat conductive block 111 exposes from the second injection molded member 3b for abutting against a heat generating component (not shown). The second surface 1112 of the heat conductive block 111 and the adjacent outer surface of the second injection molded member 3b are preferably in coplanar arrangement, but are not limited thereto.

Third Embodiment

Please refer to FIGS. 7 through 10. The heat dissipating module 1 includes a heat conductive unit 11, and the heat conductive unit 11 in the instant embodiment includes a sheet-like heat conductive block 111 and a fixing plate 112 for example. The heat conductive block 111 in the instant embodiment is identical to the heat conductive block 111 in the second embodiment, so that the instant embodiment does not state the construction of heat conductive block 111 again.

The fixing plate 112 includes an annular platy body 1121 and a retaining structure 1122 integrally extended from the platy body 1121. The platy body 1121 has an annular inner surface 1121a defining a space for accommodating the heat conductive block 111. The retaining structure 1122 includes two retaining sheets (not numbered), and the retaining sheets are respectively extended from two inside corners of the platy body 1121 toward each other for shielding part of the space surroundingly defined by the annular inner surface 1121a.

Moreover, the heat conductive block 111 is arranged in the space surroundingly defined by the annular inner surface 1121a via the bottom of the platy body 1121. A gap exists between the lateral surface 1113 of the heat conductive block 111 and the inner surface 1121a of the platy body 112, and two corners of the first surface 1111 are respectively abutted against the retaining sheets of the retaining structure 1122. The contact surface 221 of the heat input segment 22 is abutted against the first surface 1111 of the heat conductive block 111. The heat input segment 22 is arranged between the retaining sheets, and a gap exists between each retaining sheet and the heat input segment 22.

In the instant embodiment, the heat conductive block 111 is entirely arranged in the space surroundingly defined by the annular inner surface 1121a via the bottom of the platy body 1121. But in a non-shown embodiment, a height of the retaining structure 1122 in reference to the platy body 1121 can be increased or decreased for enabling the heat conductive block 111 is partially arranged in the space surroundingly defined by the annular inner surface 1121a.

The second injection molded member 3b is an integrally formed structure, and the second injection molded member 3b is substantially and seamlessly connecting to the fixing surfaces 222 of the heat input segment 22, the lateral surface 1113, a portion of the first surface 1111, which is not connected to the heat input segment 22, the inner surface 1121a, and the edges of the retaining sheets. Thus, the positions of the heat conductive block 111 and the fixing plate 112 are firmly maintained by the first surface 1111 of the heat conductive block 111 abutted against the retaining structure 1122 and the second injection molded member 3b connecting the lateral surface 1113 and the inner surface 1121a. The heat conductive set can maintain the connection between the heat conductive block 111 and the contact surface 221 of the heat input segment 22 by integrally forming the second injection molded member 3b.

Moreover, the second surface 1112 of the heat conductive block 111 exposes from the second injection molded member 3b for abutting against a heat generating component (not shown). The second surface 1112 of the heat conductive block 111, the adjacent outer surface of the second injection molded member 3b, and the adjacent surface of the fixing plate 112 are preferably in coplanar arrangement, but are not limited thereto.

Figure 8:
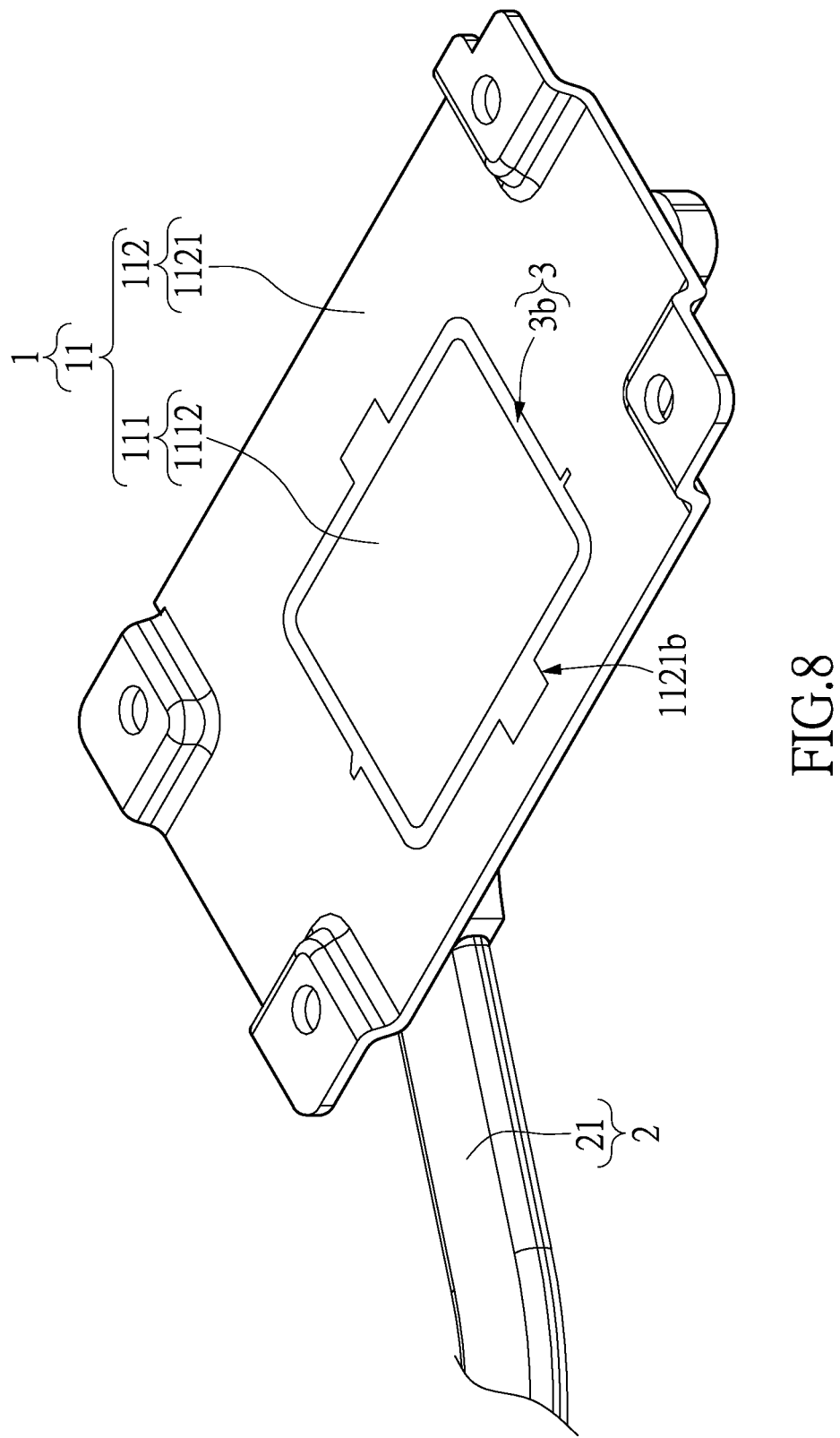
FIG. 8 is another perspective view illustrating the heat conductive set of the heat dissipating device according to the third embodiment of the instant disclosure.
Figure 9:
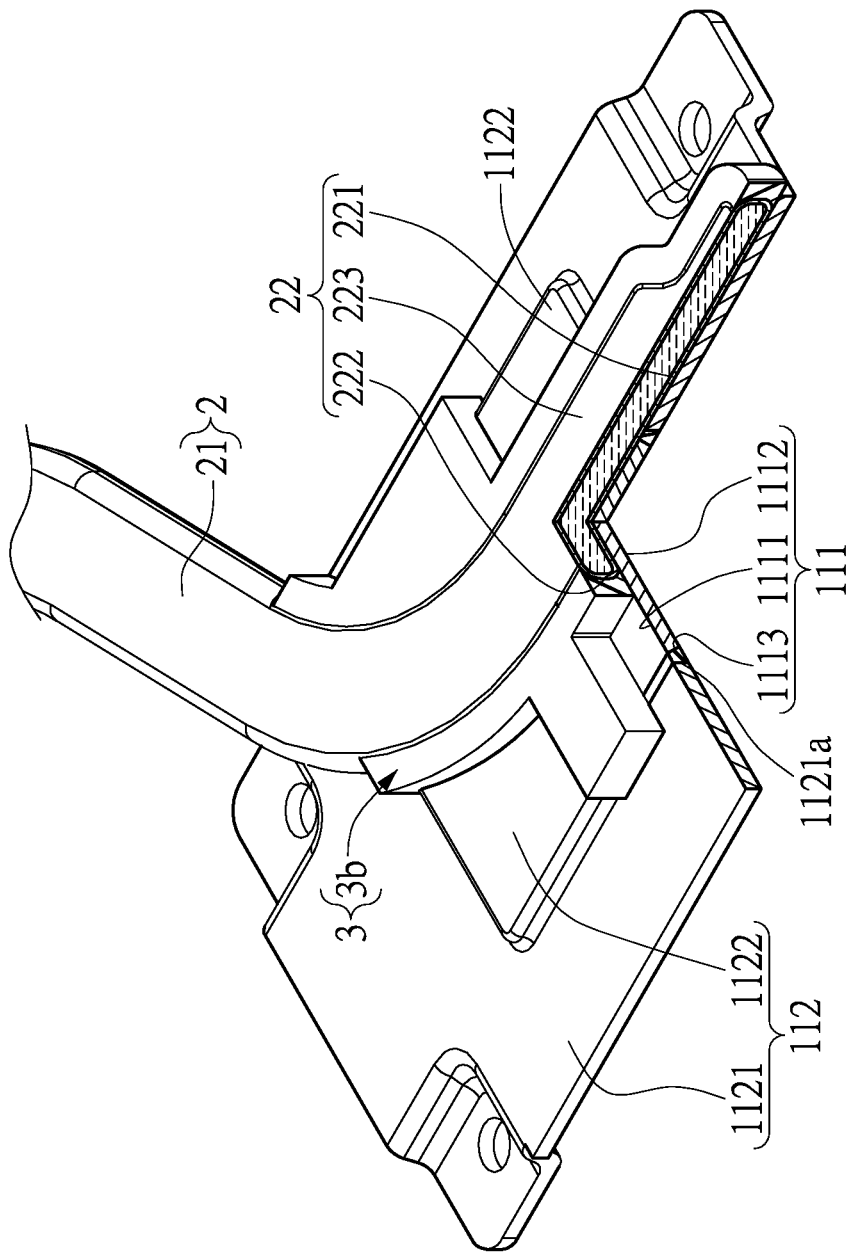
FIG. 9 is a cross-sectional view illustrating the heat conductive set of the heat dissipating device according to the third embodiment of the instant disclosure.
Figure 10:
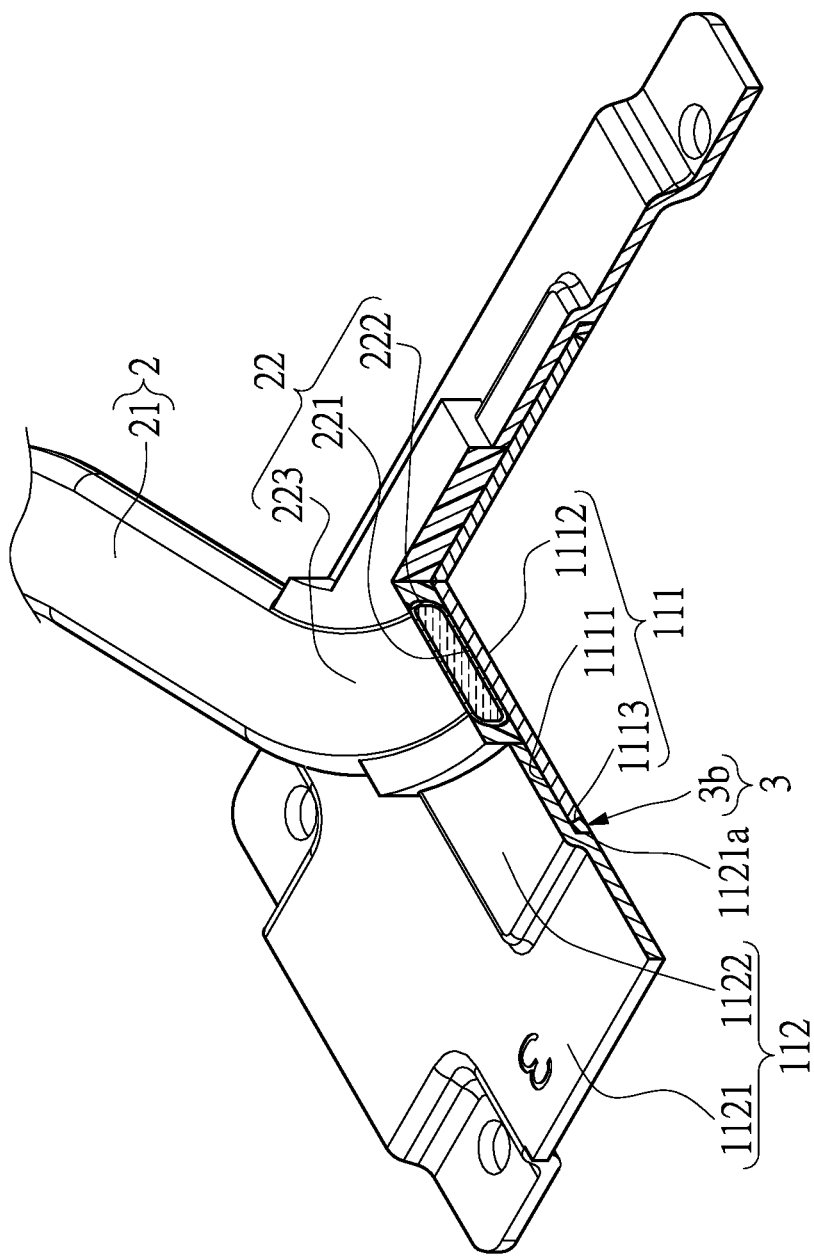
FIG. 10 is another cross-sectional view illustrating the heat conductive set of the heat dissipating device according to the third embodiment of the instant disclosure.

A plurality of communicate grooves 1121b are concavely formed on the inner surface 1121a of the platy body 1121 and respectively adjacent to the retaining sheets (as shown in FIG. 8). The communicate grooves 1121b are communicated with the gap, which is existed between the inner surface 1121a and the lateral surface 1113, so that the melted plastic can be filled in the gap via the communicate grooves 1121b.

Figure 11:
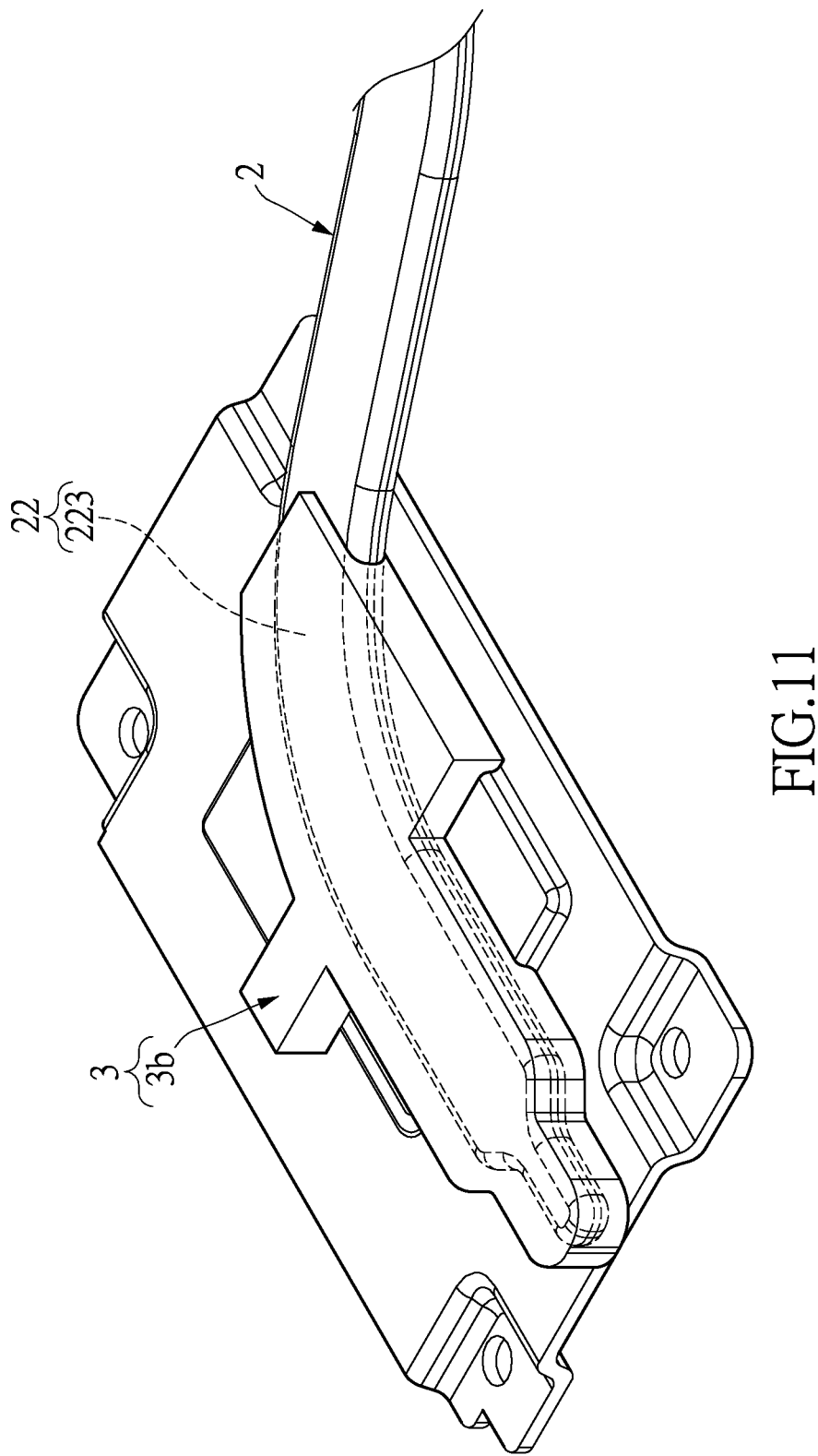
FIG. 11 is a perspective view illustrating a variety type of the heat conductive set of the heat dissipating device according to the third embodiment of the instant disclosure.

Additionally, the second injection molded member 3b in the instant embodiment does not connect to the assisting surface 223 of the heat input segment 22, that is to say, the assisting surface 223 is configured to expose from the second injection molded member 3b for reducing the thickness of the heat conductive set. However, the second injection molded member 3b can be seamlessly connecting to the assisting surface 223 (as shown in FIG. 11) for firmly fixing the heat pipe 2.

[Heat Dissipating Set]

The heat dissipating set is disclosed in the following two embodiments, but is not limited to the two embodiments. Moreover, the common structural features of the two embodiments (i.e., the structure of the heat pipe 2) have been disclosed, so that the following description does not disclose again. The injection molded member 3 disclosed in the following two embodiments is referred as the portion of the injection molded member 3 (i.e., the first injection molded member 3a) of the heat dissipating set connected to the heat output segment 23.

Fourth Embodiment

Please refer to FIGS. 1 and 2. The heat dissipating module 1 includes a heat dissipating unit 12, and the heat dissipating unit 12 in the instant embodiment takes a fan protective plate 121 and a plurality of heat dissipating fins 122 for example. The fan protective plate 121 defines a blow-in portion 1211 and a blow-out portion 1212. The heat dissipating fins 122 are stacked in one row along a first direction S, and the heat dissipating fins 122 are installed (i.e., riveted) on the blow-out portion 1212 of the fan protective plate 121. Moreover, the contact surface 231 of the heat output segment 23 is abutted against the blow-in portion 1211 of the fan protective plate 121, and the heat output segment 23 and the row of the heat dissipating fins 122 are respectively arranged at two opposite side of the fan protective plate 121 (i.e., the upper side and the lower side of the fan protective plate 121 as shown in FIG. 1).

The first injection molded member 3a is an integrally formed structure, and the first injection molded member 3a is substantially and seamlessly connecting to the fixing surfaces 232 and the assisting surface 233 of the heat output segment 23, a portion of the upper surface of the fan protective plate 121 adjacent to the contact surface 231, a side edge of the fan protective plate 121, and some heat dissipating fins 122 arranged at two opposite sides of the row of the heat dissipating fins 122 in reference to the first direction S (i.e., two of the heat dissipating fins 122 arranged at two opposite sides of the row of the heat dissipating fins 122). Thus, the heat dissipating set can maintain the connection between the fan protective plate 121 and the contact surface 231 of the heat output segment 23 by integrally forming the first injection molded member 3a.

Specifically, a portion of the first injection molded member 3a, which is regarded as a lateral wall, is vertically connected to the side edge of the fan protective plate 121 to jointly define an outlet 123. The heat dissipating fins 122 are arranged at the outlet 123 for enabling the air flow to pass through the gap existed between any two adjacent heat dissipating fins 122. Moreover, the end heat dissipating fins 122, which are arranged at two opposite sides of the row of the heat dissipating fins 122, are connected to the first injection molded member 3a for further increasing the fixing effect of the heat dissipating fins 122.

Figure 12:
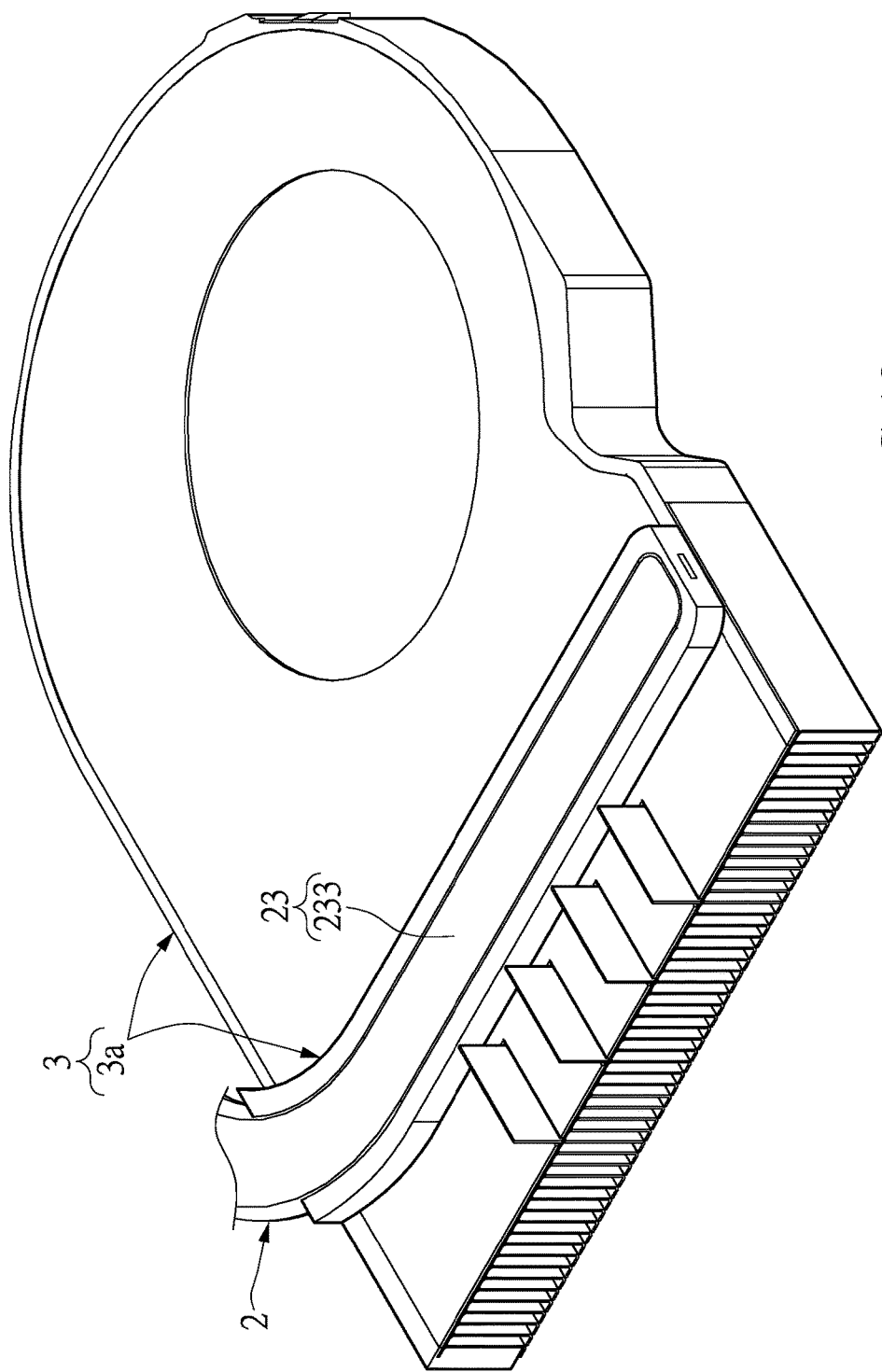
FIG. 12 is a perspective view illustrating a variety type of a heat dissipating set of the heat dissipating device according to a fourth embodiment of the instant disclosure.
Figure 13:
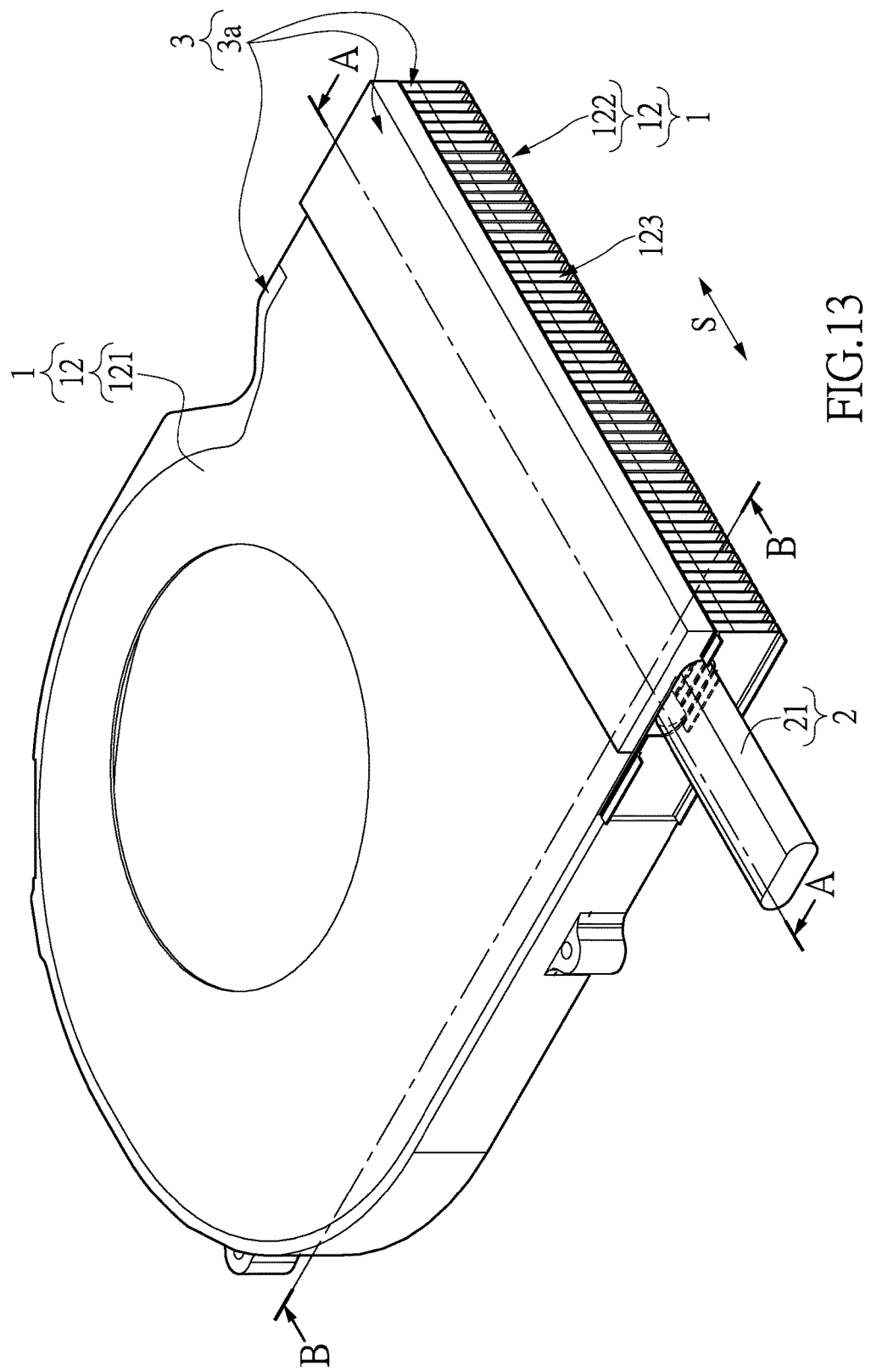
FIG. 13 is a perspective view illustrating the heat dissipating set of the heat dissipating device according to a fifth embodiment of the instant disclosure.

Additionally, the first injection molded member 3a in the instant embodiment is seamlessly connected to the assisting surface 233 for firmly fixing the heat pipe 2. However, the assisting surface 233 can be configured to expose from the first injection molded member 3a (as shown in FIG. 12) for reducing the thickness of the heat dissipating set.

Fifth Embodiment

Please refer to FIGS. 13 through 17. The heat dissipating module 1 includes a heat dissipating unit 12, and the heat dissipating unit 12 in the instant embodiment takes a fan protective plate 121 and a plurality of heat dissipating fins 122 for example. The fan protective plate 121 defines a blow-in portion 1211 and a blow-out portion 1212. The blow-in portion 1211 has an elongated thru-hole 1212a formed along a first direction S.

Figure 14:
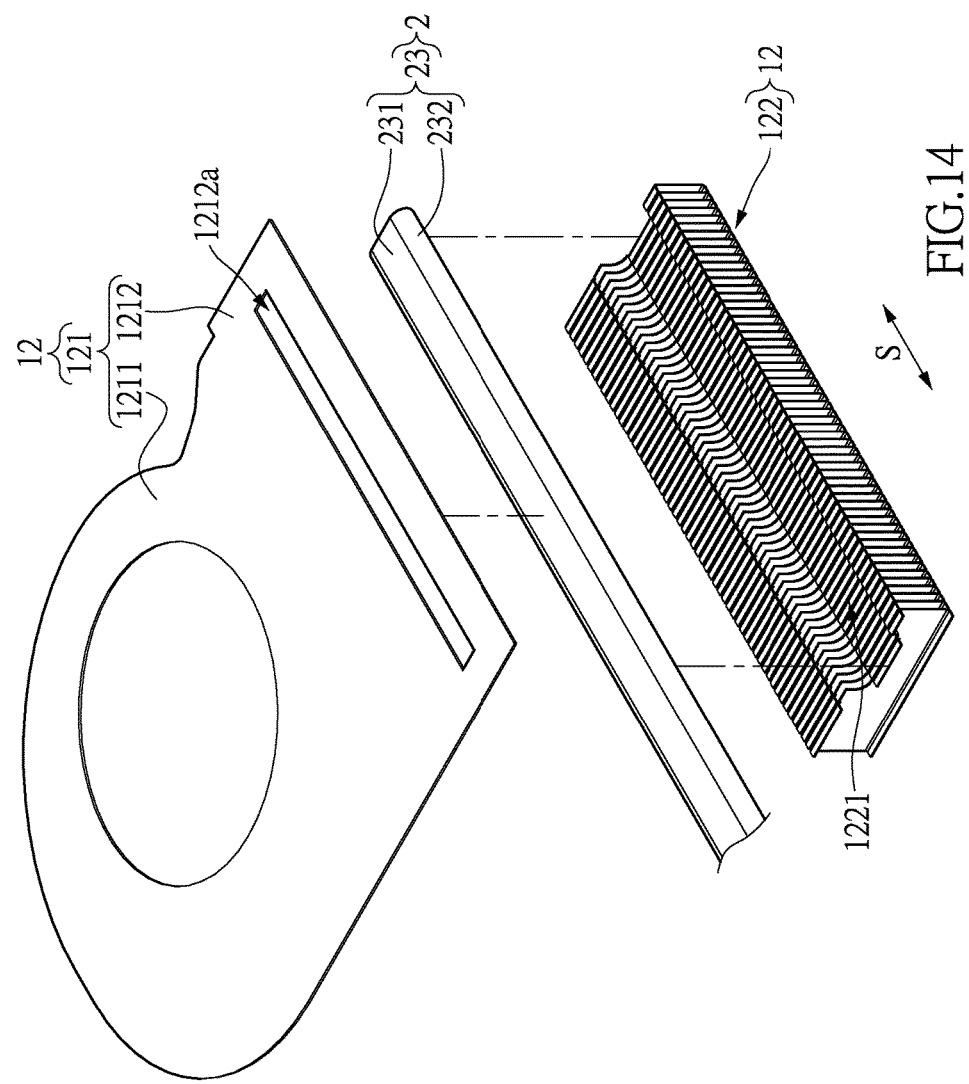
FIG. 14 is an exploded view illustrating a heat dissipating unit of the heat dissipating set of the heat dissipating device according to the fifth embodiment of the instant disclosure.

The heat dissipating fins 122 are stacked in one row along the first direction S. The heat dissipating fins 122 jointly defines an accommodating groove 1221 concavely formed on one lateral edge of the row of heat dissipating fins 122 (i.e., the top edge of the heat dissipating fins 122 as shown in FIG. 14) along the first direction S, and the accommodating groove 1221 is communicated with the gap, which is existed between any two adjacent heat dissipating fins 122. The heat dissipating fins 122 are disposed on the blow-out portion 1212 of the fan protective plate 121. The thru-hole 1212a of the fan protective plate 121 is communicated with the gap, which is existed between any two adjacent heat dissipating fins 122, for enabling the melted plastic to fill in each gap via the thru-hole 1212a.

Figure 15:
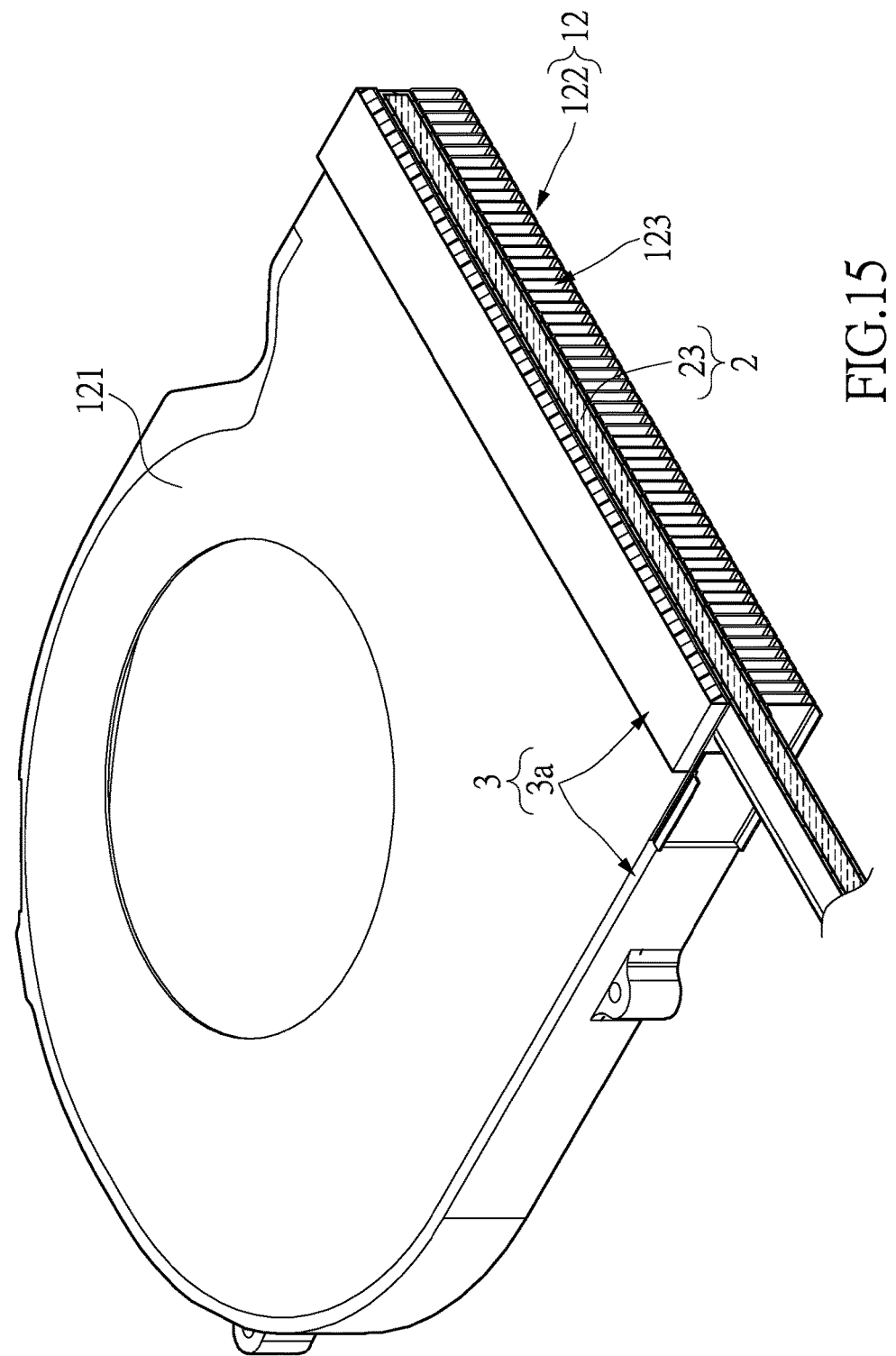
FIG. 15 is a cross-sectional view illustrating the heat dissipating set of the heat dissipating device according to the fifth embodiment of the instant disclosure.
Figure 16:
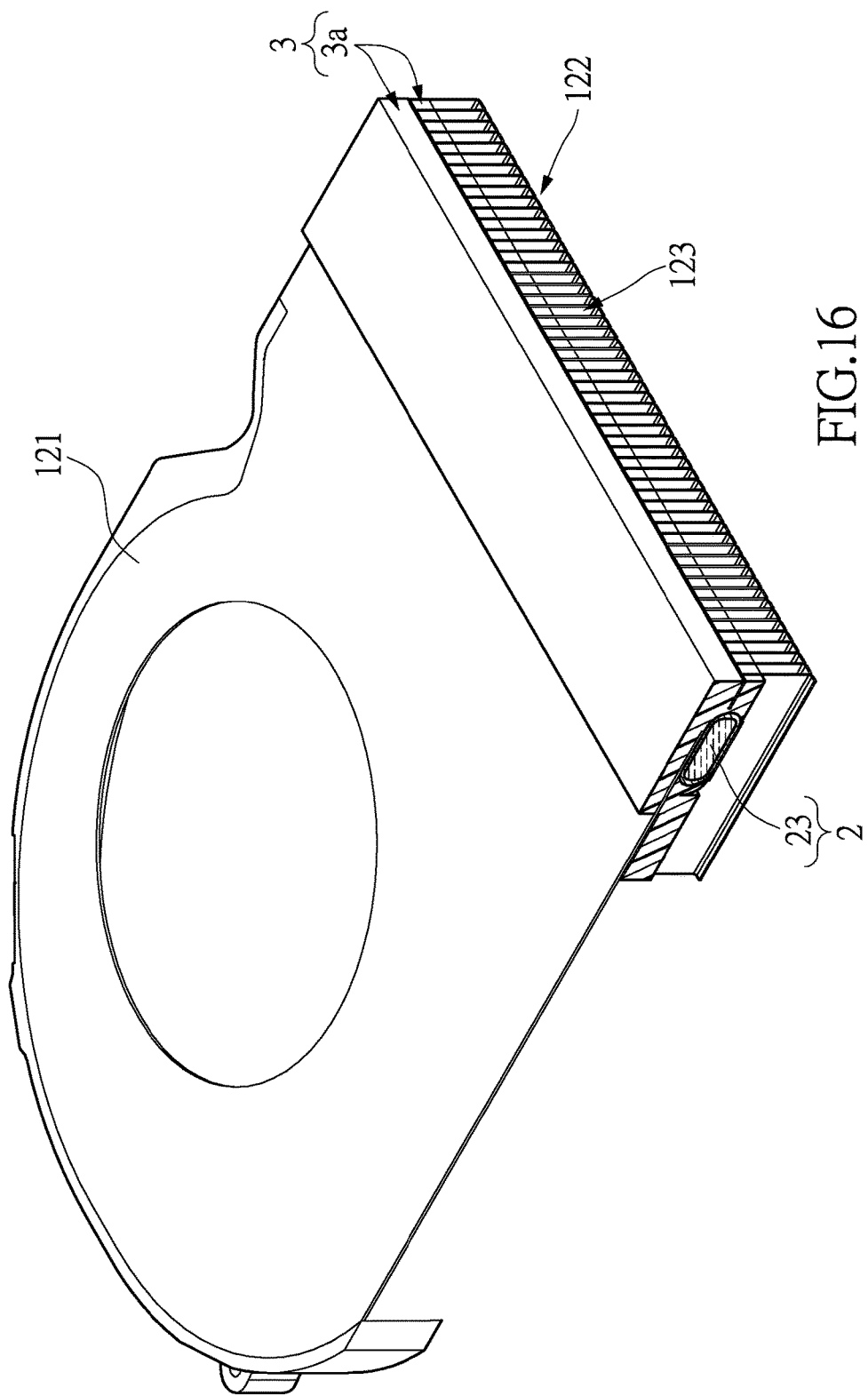
FIG. 16 is another cross-sectional view illustrating the heat dissipating set of the heat dissipating device according to the fifth embodiment of the instant disclosure.
Figure 17:
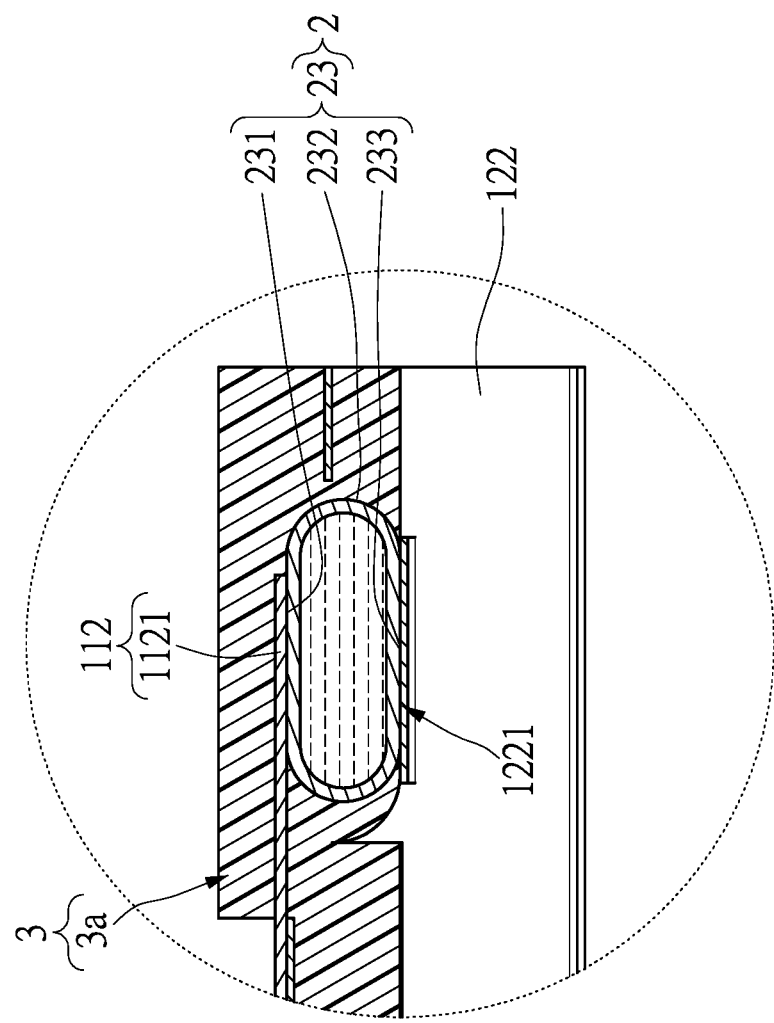
FIG. 17 is a partially enlarger view of FIG. 16.

Moreover, the heat output segment 23 is clipped between a bottom wall of the accommodating groove 1221 and the fan protective plate 121, that is to say, the heat output segment 23 and the heat dissipating fins 122 are approximately arranged at the same side of the fan protective plate 121 (i.e., the lower side of the fan protective plate 121 as shown in FIG. 15). The contact surface 231 of the heat output segment 23 is abutted against the blow-out portion 1212 of the fan protective plate 121 without shielding the thru-hole 1212a. The assisting surface 233 of the heat output segment 23 is abutted against the bottom wall of the accommodating groove 1221, and a gap is existed between each fixing surface 232 of the heat output segment 23 and an adjacent lateral wall of the accommodating groove 1221 as shown in FIG. 17.

The first injection molded member 3a is an integrally formed structure, and the first injection molded member 3a is substantially and seamlessly connecting to the fixing surface 232, the lateral walls of the accommodating groove 1221, a portion of each heat dissipating fin 122 adjacent to lateral walls of the accommodating groove 1221, the blow-out portion 1212 of the fan protective plate, and a side edge of the fan protective plate 121. Thus, the heat dissipating set can maintain the positions of the fan protective plate 121, the heat output segment 23, and the heat dissipating fins 122 by integrally forming the first injection molded member 3a, thereby further maintaining the connection between the fan protective plate 121 and the contact surface 231 of the heat output segment 23.

Specifically, a portion of the first injection molded member 3a, which is regarded as a lateral wall, is vertically connected to the side edge of the fan protective plate 121 to jointly define an outlet 123. The heat dissipating fins 122 are arranged at the outlet 123 for enabling the air flow to pass through the gap existed between any two adjacent heat dissipating fins 122. Moreover, the end heat dissipating fins 122, which are arranged at two opposite sides of the row of the heat dissipating fins 122, are connected to the first injection molded member 3a for further increasing the fixing effect of the heat dissipating fins 122.

Additionally, the heat output segment 23 transfers heat to the fan protective plate 121 and the heat dissipating fins 122 via the contact surface 231 and the assisting surface 233 by being clipped between the bottom wall of the accommodating groove 1221 and the fan protective plate 121, thereby increasing the heat transfer effect.

The Possible Effects of the Instant Embodiment

In summary, the heat dissipating device of the instant disclosure is formed without welding manner, and the components of the heat dissipating device are connected with each other by the injection molded member, such that the construction of the heat dissipating device intends to be produced by injection molding for promoting the manufacturing process of the heat dissipating device to become automatic process, thereby reducing the cost of manpower.

Moreover, the heat dissipating device of the instant disclosure can use the injection molded member to replace with some component (i.e., the fixing plate, the heat conductive block, the side wall of fan) for reducing the cost of material.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A heat dissipating device, comprising:
   a heat dissipating module having a fan protective plate;
   a heat pipe having a heat transfer segment, a heat input segment, and a heat output segment, the heat input segment and the heat output segment respectively extended from two opposite ends of the heat transfer segment; wherein each of the heat input segment and the heat output segment includes a contact surface and an assisting surface opposite to the contact surface, and the contact surface of the heat output segment is abutted against the fan protective plate of the heat dissipating module;
   a first injection molded plastic member being an integrally formed structure and the first injection molded plastic member being adhered to the heat output segment of the heat pipe and the fan protective plate to fix the contact surface of the heat output segment of the heat pipe onto the fan protective plate of the heat dissipating module, thereby without using a welding manner to maintain the connection between the fan protective plate of the heat dissipating module and the abutted contact surface of the heat output segment; and
   a second injection molded plastic member being an integrally formed structure and being adhered to the heat input segment of the heat pipe, wherein the contact surface of the heat input segment of the heat pipe is abutted against a heat generating component, and thus heat generated by the heat generating component is dissipated through the heat input segment, the heat transfer segment, the heat output segment, and the heat dissipating module in order;
   wherein the heat dissipating module comprises a plurality of heat dissipating fins stacked in one row along a first direction, and the heat dissipating fins are disposed on the fan protective plate, wherein the assisting surface of the heat output segment of the heat pipe is exposed from the first injection molded plastic member and is arranged away from the heat dissipating fins.

2. The heat dissipating device according to claim 1, wherein the heat dissipating module includes a heat conductive unit having a heat conductive block, the heat conductive block has a first surface and an opposite second surface, the contact surface of the heat input segment is abutted against the first surface of the heat conductive block, the heat input segment has two arced fixing surfaces respectively extended from two opposite edges of the contact surface thereof; wherein the second injection molded plastic member is seamlessly connected to the fixing surfaces of the heat input segment and the heat conductive block, and the second injection molded plastic member is configured to maintain the connection between the heat conductive block and the heat input segment, the second surface of the heat conductive block is exposed from the second injection molded plastic member.

3. The heat dissipating device according to claim 2, wherein the heat conductive block includes an annular lateral surface connecting an edge of the first surface and an edge of the second surface, the cross-section of the lateral surface of the heat conductive block gradually reduces from the first surface to the second surface, the second injection molded plastic member is seamlessly connecting to the lateral surface of the heat conductive block.

4. The heat dissipating device according to claim 3, wherein the heat conductive unit further comprises a fixing plate having an annular platy body and a retaining structure integrally extended from the platy body, the platy body has an annular inner surface, the heat conductive block is at least partially arranged in a space surroundingly defined by the inner surface of the platy body, a gap exists between the lateral surface of the heat conductive block and the inner surface of the platy body, part of the first surface of the heat conductive block is abutted on the retaining structure; wherein the second injection molded plastic member is seamlessly connecting to the inner surface of the platy body, and the second injection molded plastic member is configured to maintain the positions of the lateral surface of the heat conductive block and the inner surface of the platy body.

5. The heat dissipating device according to claim 1, wherein the heat output segment has two arced fixing surfaces respectively extended from two opposite edges of the contact surface thereof, wherein the first injection molded plastic member is seamlessly connecting to the fixing surfaces of the heat output segment and the fan protective plate.

6. The heat dissipating device according to claim 5, wherein a portion of the first injection molded plastic member is vertically connected to a side edge of the fan protective plate to jointly define an outlet.

7. The heat dissipating device according to claim 6, wherein the heat dissipating fins are arranged at the outlet, wherein two of the heat dissipating fins arranged at two opposite sides of the row of the heat dissipating fins are at least partially connected to the first injection molded plastic member.

* * * * *